(12) United States Patent
Hayashi et al.

(10) Patent No.: US 7,400,143 B2
(45) Date of Patent: Jul. 15, 2008

(54) MAGNETIC BIAS FILM AND MAGNETIC SENSOR USING THE SAME

(75) Inventors: Nobukazu Hayashi, Osaka (JP); Kazuhiro Onaka, Hyogo (JP); Yukio Nakao, Osaka (JP); Masataka Tagawa, Fukui (JP); Kouji Nabetani, Fukui (JP); Masako Yamaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 303 days.

(21) Appl. No.: 10/570,268

(22) PCT Filed: Sep. 6, 2004

(86) PCT No.: PCT/JP2004/013266

§ 371 (c)(1),
(2), (4) Date: Mar. 2, 2006

(87) PCT Pub. No.: WO2005/024861

PCT Pub. Date: Mar. 17, 2005

(65) Prior Publication Data
US 2007/0018641 A1   Jan. 25, 2007

(30) Foreign Application Priority Data
Sep. 5, 2003 (JP) ............................. 2003-313945
Jan. 5, 2004 (JP) ............................. 2004-000074

(51) Int. Cl.
*G01R 33/09* (2006.01)
*G01R 33/02* (2006.01)
*G01B 7/30* (2006.01)

(52) U.S. Cl. ............. 324/252; 324/207.21; 324/207.25; 324/249; 428/693.1

(58) Field of Classification Search ......... 324/173–174, 324/207.21, 207.25, 244, 249, 252; 257/421, 257/425, 427; 438/3; 428/692.1, 693.1
See application file for complete search history.

(56) References Cited

U.S. PATENT DOCUMENTS

| | | | | |
|---|---|---|---|---|
| 5,936,400 A | * | 8/1999 | Tchertkov et al. | 324/207.21 |
| 6,084,405 A | * | 7/2000 | Suzuki | 324/252 |
| 6,100,686 A | * | 8/2000 | Van Delden et al. | 324/252 |
| 6,384,600 B1 | * | 5/2002 | Coehoorn | 324/252 |
| 7,176,679 B2 | * | 2/2007 | Baragatti et al. | 324/252 |

FOREIGN PATENT DOCUMENTS

| | | |
|---|---|---|
| JP | 2002-74617 | 3/2002 |
| JP | 2002-74620 | 3/2002 |
| JP | 2002-176210 | 6/2002 |
| JP | 2003-14458 | 1/2003 |
| WO | 03/056276 | 7/2003 |

* cited by examiner

*Primary Examiner*—Bot LeDynh
(74) *Attorney, Agent, or Firm*—Wenderoth, Lind & Ponack, L.L.P.

(57) ABSTRACT

A magnetic bias film 9 includes a magnetic bias magnet 11 that has magnetic layers and generates a magnetic field within a plane perpendicular to a lamination direction of the magnetic layers, which is manufactured in the shape of substantially a rectangular prism having a long side, a short side, and a thickness (in the lamination direction) in order of decreasing lengths. A ratio of the long side with respect to the short side of the magnetic bias magnet 11 in length is in a range of 5 to 200.

20 Claims, 13 Drawing Sheets

PRIOR ART      FIG. 20
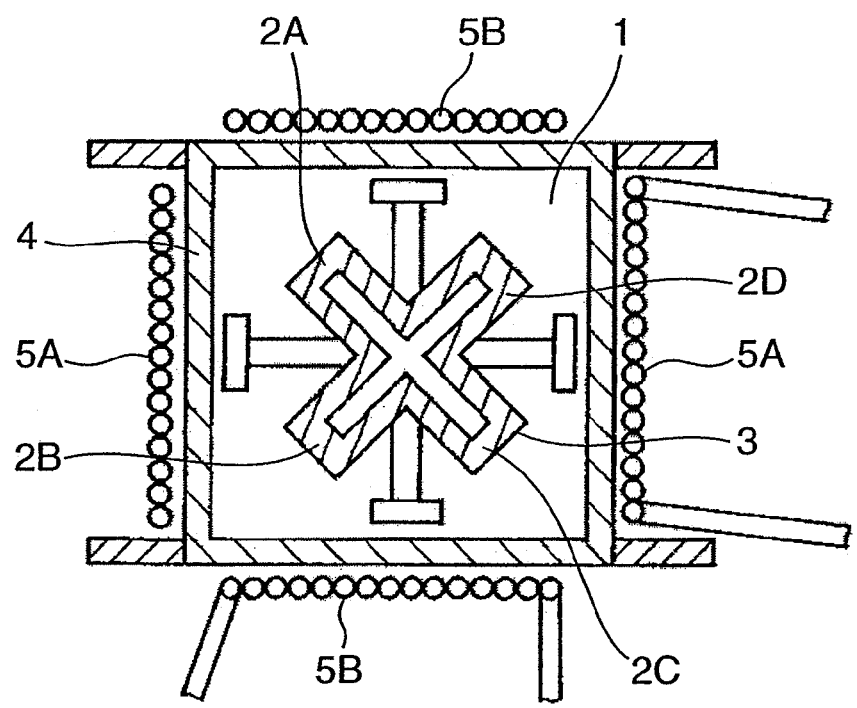

MAGNETIC BIAS FILM AND MAGNETIC SENSOR USING THE SAME

This is a 371 national phase application of PCT/JP04/13266 filed 06 Sep. 2004, which claims priority to Japanese Patent Application No. 2003-313945 filed 05 Sep. 2003, and Japanese Patent Application No. 2004-000074 filed 05 Jan. 2004, the contents of which are incorporated herein by reference.

TECHNICAL FIELD

The present invention relates to a magnetic bias film used in various electronic devices and a magnetic sensor using the same.

BACKGROUND ART

A magnetic sensor in the related art is disclosed, for example, in JP-A-2003-14458. FIG. 19 is a perspective view showing a magnetic sensor in the related art. FIG. 20 is a cross section taken along the line II-II' of the magnetic sensor in the related art shown in FIG. 19.

The magnetic sensor is of a configuration including a Wheatstone bridge circuit 3 comprising four detecting elements 2A through 2D provided on the top surface of a substrate 1, a holder 4 holding the substrate 1 to cover the substrate 1 having the Wheatstone bridge circuit, and a first coil 5A and a second coil 5B comprising conductive wires wound around the holder 4 a specific number of turns and applying magnetic biases that are orthogonal to each other.

Because this magnetic sensor uses the first coil 5A and the second coil 5B wound around the holder 4 as means for applying magnetic biases, it is increased in size and a reduction in size cannot be readily achieved. Also, in order to generate magnetic fields, it is necessary to flow a current through each of the first coil 5A and the second coil 5B, and power consumption is consequently increased.

Also, for example, WO 03/056276 discloses a method of using magnetic bias films formed of a thin film of magnet as means for applying magnetic biases.

This magnetic sensor can solve the problem discussed above because it does not use coils but it uses magnetic bias films formed of substantially a square thin film of magnet when viewed in plan as means for applying magnetic biases.

In order to further reduce the magnetic sensor in size, the magnetic bias film has to be reduced in size as well. To this end, it is necessary to make the bottom area of the magnetic bias film smaller.

In this case, however, a magnetic field generated by the magnetic bias film becomes smaller, and there arises a problem that a desired magnetic field cannot be obtained. Further, when a large magnetic field is applied to such a magnetic bias film from the outside, the orientation of the magnetic bias is affected, and there arises a problem that an output of the magnetic sensor is affected.

DISCLOSURE OF THE INVENTION

The invention solves the problems of the magnetic bias film in the related art as discussed above, and therefore has an object to provide a magnetic bias film that can be reduced in size and is capable of obtaining a stable and desired magnetic field and a magnetic sensor using the same.

In order to achieve the above and other objects, a magnetic bias film according to one aspect of the invention is a magnetic bias film including plural magnetic bias magnets each having magnetic layers and generating a magnetic field within a plane perpendicular to a lamination direction of the magnetic layers, and characterized in that the magnetic bias magnet is manufactured in a shape of substantially a rectangular prism having a long side, a short side, and a thickness in the lamination direction in order of decreasing lengths while a ratio of the long side with respect to the short side in length is in a range of 5 to 200, and the plural magnetic bias magnets are disposed in a short side direction.

In order to achieve the above and other objects, a magnetic bias film according to one aspect of the invention is a magnetic bias film including a magnetic bias magnet that has magnetic layers and generates a magnetic field within a plane perpendicular to a lamination direction of the magnetic layers, and characterized in that the magnetic bias magnet is manufactured in a shape of substantially a rectangular prism having a long side, a short side, and a thickness in the lamination direction in order of decreasing lengths while a ratio of the long side with respect to the short side in length is in a range of 5 to 200.

According to this configuration, the magnetic bias film of the invention includes the magnetic bias magnets, each of which is manufactured in the shape of substantially a rectangular prism having the long side, the short side, and the thickness in the lamination direction in order of decreasing lengths. The ratio of the long side with respect to the short side in length of the magnetic bias magnet is in a range of 5 to 200, and the plural magnetic bias magnets are disposed in the short side direction. The direction of a magnetic field generated within the plane perpendicular to the lamination direction of the magnetic layers contained in the magnetic bias magnet is therefore stabilized, and a stronger magnetic field can be obtained. Hence, not only can the magnetic bias film be reduced in size, but also the magnetic sensor using the same can be reduced in size at the same time.

A magnetic sensor according to another aspect of the invention is a magnetic sensor, characterized by including: a substrate; a first magnetic detection portion provided with at least two magnetic detecting elements formed on a main surface side of the substrate; a second magnetic detection portion provided with at least two magnetic detecting elements formed on the main surface side of the substrate; a first magnetic bias film provided at a position opposing the first magnetic detection portion; and a second magnetic bias film provided at a position opposing the second magnetic detection portion, wherein the first and second magnetic bias films are the magnetic bias film according to any of claims 1 through 13, and an orientation of a magnetic field generated by the first magnetic bias film and an orientation of a magnetic field generated by the second magnetic bias film are different.

According to this configuration, in the magnetic sensor of the invention, the first and second magnetic detection portions, each having at least two magnetic detecting elements, are formed on the main surface side of the substrate. The first magnetic bias film is provided at a position opposing the first magnetic detection portion, and the second magnetic bias film is provided at a position opposing the second magnetic detection portion. It is thus possible to apply the magnetic biases to the magnetic detection portions effectively.

Also, the orientations of the magnetic fields generated by the first magnetic bias film and the second magnetic bias film are different. This gives rise to a phase difference between output waveforms from the first and second magnetic detection portions. Hence, by detecting a ratio of these two waveform outputs, it is possible to obtain a magnetic sensor of a simple configuration capable of detecting the direction of an external magnetic field.

The objects, features, aspects, and advantages of the invention will become more apparent by the following detailed descriptions and the accompanying drawings.

BRIEF DESCRIPTION OF THE DRAWINGS

FIG. 20 is a cross section taken along the line II-II' of the magnetic sensor in the related art.

BEST MODE FOR CARRYING OUT THE INVENTION

Hereinafter, embodiments of the invention will be described with reference to the drawings. First through third embodiments below will describe magnetic bias films with which the direction of a magnetic field is stabilized by changing the shape or the configuration. Fourth and fifth embodiments will describe a magnetic sensor using these magnetic bias films.

Initially, in the first embodiment, the direction of a magnetic field is stabilized by manufacturing a magnetic bias film of a single-layer structure in the shape of a rectangular prism. The second embodiment is different from the first embodiment, and will describe a magnetic bias film of a laminated structure. The third embodiment will describe a configuration as a combination of the first and second embodiments, that is, an example to stabilize the direction of a magnetic field by manufacturing a magnetic bias film of a laminated structure in the shape of a rectangular prism.

First Embodiment

Figure 1:
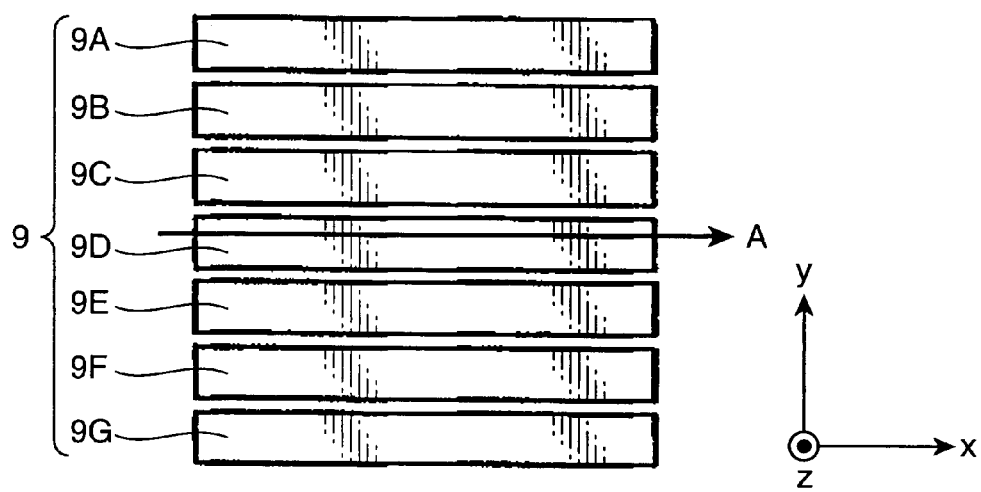
FIG. 1 is a top view of a magnetic bias film according to a first embodiment of the invention.

FIG. 1 is a top view of a magnetic bias film according to a first embodiment of the invention. This magnetic bias film 9 comprises plural magnetic bias magnets 9A through 9G, and each of these magnetic bias magnets 9A through 9G generates a magnetic field in a direction indicated by an arrow A (x direction).

The magnetic bias magnets 9A through 9G are made of CoPt alloy in the shape of substantially a rectangular prism having a long side, a short side, and a thickness (lamination direction) in order of decreasing lengths. Herein, the term, "substantially" a rectangular prism, is used to include not only a mathematically perfect rectangular prism, but also those having, for example, warping, roundness or chamfers on the edges or the apexes, or irregularities on the surface due to restrictions of manufacturing techniques, but deemed as being in the shape of a rectangular prism as a whole. The concept includes magnetic bias magnets 9A through 9G in the shape of a square cone platform having the bottom area larger than the top area and inclined side surfaces due to restrictions of manufacturing techniques. This applies to all the embodiments below.

Also, CoPt alloy has large magnetocrystalline anisotropy in addition to an excellent magnet property. It is therefore preferable as a material of the magnetic bias magnet to which the stability of the magnetic field direction is required.

In this case, the long side, the short side, and the thickness are defined as follows using the coordinate axes shown in FIG. 1. That is, a direction perpendicular to the sheet surface (z direction) corresponds to the thickness direction, the x direction of the rectangle shown in FIG. 1 corresponds to the long side, and the y direction corresponds to the short side. As to the respective sides in this embodiment, the length of the long side is 700 µm, the length of the short side is 140 µm, and the thickness is 2000 Å (=0.2 µm). An interval among the magnetic bias magnets 9A through 9G is 10 µm.

A ratio of the long side with respect to the short side in length (=length of long side/length of short side) of the magnetic bias magnet 9A, that is, the aspect ratio, is 700 µm/140 µm=5. Hence, the magnetic bias magnet 9A within the sheet surface is of a rectangular shape, and magnetic shape anisotropy is provided in the long side direction (x direction).

Also, the aspect ratio of the long side with respect to the thickness (=length of long side/thickness) of the magnetic bias magnet 9A is 700 µm/0.2 µm=3500. Further, the aspect ratio of the short side with respect to the thickness (=length of short side/thickness) of the magnetic bias magnet 9A is 140 µm/0.2 µm=700.

The other magnetic bias magnets 9B through 9G are of the same configuration as the magnetic bias magnet 9A, and they are arrayed in the lateral direction while the magnetic field directions are aligned. These magnetic bias magnets 9A through 9G together constitute a magnetic bias film 9.

A manufacturing method of the magnetic bias film 9 configured as described above will now be described.

Initially, a CoPt film is formed across the entire surface of a substrate or the like by means of vapor deposition or sputtering. The CoPt film is then divided by means of exposure, etching, or the like to obtain plural CoPt films in the shape of substantially a rectangular prism. By applying a specific magnetic field to these plural CoPt films in the shape of substantially a rectangular prim in the long side direction (x direction), the CoPt films in the shape of substantially a rectangular prism are magnetized in the long side direction. The magnetic bias magnets 9A through 9G can be thus obtained.

The magnetic bias film 9 of such a configuration seldom changes the magnetization direction upon application of a large magnetic field from the outside. The reason why is not completely explained logically; however, the reason why is roughly thought as follows.

Figure 2:
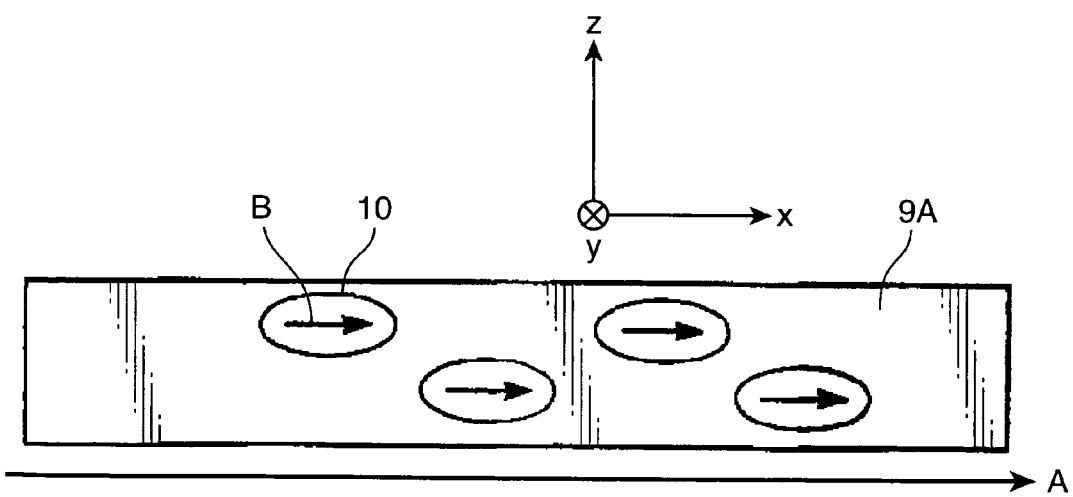
FIG. 2 is a longitudinal cross section of a magnetic bias magnet forming the magnetic bias film according to the first embodiment of the invention.

FIG. 2 is a longitudinal cross section (the cross section on the x-z plane of FIG. 1) of the magnetic bias magnet forming the magnetic bias film 9 according to the first embodiment of the invention. Crystal grains 10 are present within the magnetic bias magnets 9A through 9G. As is shown in FIG. 2, the crystal grains 10 are thought to be of substantially an elliptical shape having the long axis in the long side direction (x direction) of the magnetic bias magnets 9A through 9G. The magnetic moment present within the crystal grain 10 is readily oriented in a direction indicated by an arrow B as a whole, and the direction of the magnetic moment hardly changes even when a large magnetic field is applied from the outside.

In this case, the reason why the crystal grain 10 takes on substantially an elliptical shape is not clear. However, it is assumed that by making the magnetic bias magnets 9A through 9G in a markedly flattened rectangular shape by setting the aspect ratio of the long side and the short side to 5 or greater instead of making them in a square shape when viewed in plan, the crystal grains 10 take on substantially an elliptical shape at the time of film deposition or polarization.

Further, influences of a so-called demagnetizing field that depend on the shape (the aspect ratio of the long side and the short side) of the magnetic bias magnets 9A through 9G are thought to be present to no small extent. Generally, the (effective) magnetic field exerting within a magnetic body becomes smaller in magnitude comparable to the demagnetizing field due to the magnetic field applied from the outside. The magnitude of the demagnetizing field is proportional to the magnitude of the magnetization of the magnetic body, and a proportional factor is referred to as a demagnetizing factor.

Given the shape of the magnetic bias magnet 9A used in this embodiment as an example by ignoring the thickness, then the demagnetizing factor in the long side direction (x direction) is small whereas the demagnetizing factor in the short side direction (y direction) is large. Hence, the effective field in the long side direction becomes large whereas the effective field in the short side direction becomes small. It is thus understood that the magnetization in the long side direction having a large effective field is more stable.

The aspect ratio of the long side and the short side of the magnetic bias magnets 9A through 9G is preferably in a range of 5 to 200, and more preferably in a range of 10 to 200. That is to say, when the aspect ratio of the long side and the short side of the magnetic bias magnets 9A through 9G is smaller than 5, the stability of the bias magnetic fields generated by the magnetic bias magnets 9A through 9G is deteriorated when a large magnetic field is applied from the outside. This can be understood from the view point of the demagnetizing field described above.

Meanwhile, when the aspect ratio of the long side and the short side of the magnetic bias magnets 9A through 9G is larger than 200, the absolute strength of the bias magnetic fields generated by the magnetic bias magnets 9A through 9G becomes too large to obtain the most appropriate bias magnetic field. Conversely, when the bias magnetic field is weakened while keeping the aspect ratio intact, manufacturing becomes difficult because of a short length of the short side.

The aspect ratio of the long side and the short side of the magnetic bias magnet 9A is set in a range of 5 to 200 for these reasons, and when set in this range, the bias magnetic field generated by the magnetic bias magnet 9A can be stabilized.

As has been described, when the crystal grains 10 are not of a circular shape when viewed in plan but of an anisotropic shape, which is substantially an elliptical shape having the long axis in the long side direction of the magnetic bias magnet 9A, a bias magnetic field that remains stable against a magnetic field from the outside is thought to generate.

The direction of the long axis of the crystal grains 10 of substantially an elliptical shape is also a direction perpendicular to the thickness direction. The reason why for this configuration is thought to be the same as the reason why the long axis of substantially an elliptical shape is readily oriented in the long side direction due to the aspect ratio of the long side and the short side, because the length of the magnetic bias magnet 9A in the thickness direction is shorter than the lengths in the long side and short side directions. Also with the aid of this configuration, the magnetic bias magnet 9A seldom changes the magnetization direction even when a large magnetic field is applied from the outside.

As the magnetic bias film according to the first embodiment of the invention described above, the magnetic bias film 9 is formed by arraying the plural magnetic bias magnets 9A through 9D, each of which generates a magnetic field and is in the shape of substantially a rectangular prism having the long side, the short side, and the thickness in order of decreasing lengths, in a lateral direction while aligning the directions of the magnetic fields. Further, because the aspect ratio of the long side and the short side of all the magnetic bias magnets 9A through 9G is set in a range of 5 to 200, the magnetization direction seldom changes even when a large magnetic field is applied from the outside. It is thus possible to generate a stable magnetic bias.

In addition, the thickness of the magnetic bias film 9 is preferably in a range of 250 Å to 2500 Å. When the thickness of the magnetic bias film 9 is smaller than 250 Å, the magnetic field generated by a magnetic layer 12 becomes smaller. Meanwhile, the strength of the magnetic field hardly changes by making the thickness of the magnetic bias film 9 larger than 2500 Å. It is therefore preferable to set the thickness of the magnetic bias film 9 in a range of 250 Å to 2500 Å.

Further, the magnetic bias magnets 9A through 9G may be formed in a divided state from the start instead of using the method for obtaining the magnetic bias magnets 9A through 9G by forming a large CoPt film first and then dividing the film by means of etching. In this case, the CoPt film is formed using a mask having the shapes of the magnetic bias magnets 9A through 9G.

Second Embodiment

Figure 3:
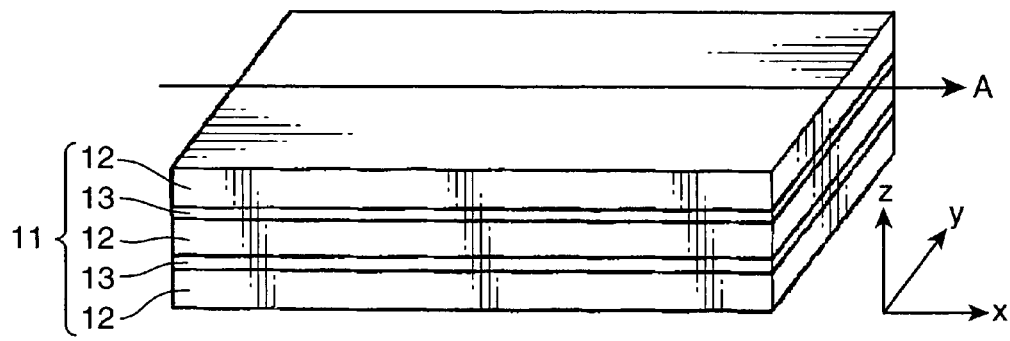
FIG. 3 is a perspective view of a magnetic bias film according to a second embodiment of the invention.

FIG. 3 is a perspective view of a magnetic bias film according to a second embodiment of the invention. Referring to FIG. 3, a magnetic bias film 11 has a structure in which plural magnetic layers 12 and non-magnetic layers 13 are laminated alternately. The magnetic layer 12 is made of CoPt alloy, and generates a magnetic field in a direction indicated by an arrow A (x direction) when magnetized in a certain direction. Also, the non-magnetic layer 13 is made of Cr. Strictly speaking, Cr is an antiferromagnetic material and is not non-magnetic.

However, because it is not a ferromagnetic material, the term, "non-magnetic", is used for Cr.

As to the respective sides in this embodiment, the length of the long side (x direction) is 700 μm, the length of the short side (y direction) is 140 μm, and the thicknesses (z direction) of the magnetic layer 12 and the non-magnetic layer 13 are 2000 Å and 250 Å, respectively. The aspect ratio of the long side with respect to the short side of the magnetic bias film 11 is 700 ml/140 μm=5. The magnetic bias film 11 within the sheet surface is therefore of a rectangular shape, and magnetic shape anisotropy is provided in the long side direction (x direction).

Also, the aspect ratio of the long side with respect to the thickness (=length of long side/thickness) of the magnetic layer 12 is 700 μm/0.2 μm=3500. Further, the aspect ratio of the short side with respect to the thickness (=length of short side/thickness) of the magnetic layer 12 is 140 μm/0.2=700.

In this embodiment, because there is a single magnetic bias magnet, it is equivalent to the magnetic bias film.

A manufacturing method of the magnetic bias film 11 configured as described above will now be described. The magnetic layer 12 made of CoPt alloy is formed on the surface of a substrate (not shown) by means of vapor deposition or sputtering, and the non-magnetic layer 13 made of Cr is formed on the top surface of this magnetic layer 12 by means of vapor deposition or sputtering. Further, the magnetic layer 12 is formed on the top surface of this non-magnetic layer 13, and by repeating these procedures, it is possible to obtain a laminated film in which plural magnetic layers 12 and non-magnetic layers 13 are laminated in the z direction.

By applying a specific magnetic field in a certain direction (x direction in FIG. 3) perpendicular to the lamination direction of these magnetic layers 12, the magnetic layers 12 in the laminated film are magnetized in a direction (x direction) indicated by an arrow A. The magnetic bias film 11 can be thus obtained.

The magnetic bias magnet 11 is not of substantially a square shape, and as in the first embodiment above, the aspect ratio of the short side (y direction) and the long side (x direction) is preferably in a range of 5 to 200, and more preferably in a range of 10 to 200. More specifically, when the aspect ratio of the long side and the short side of the magnetic bias magnet 11 is smaller than 5, the stability of the bias magnetic field is deteriorated, and when the aspect ratio is larger than 200, the absolute strength of the bias magnetic field becomes too large.

The magnetic bias film 11 of such a laminated structure is able to generate a large magnetic field in comparison with a magnetic bias film of a single-layer structure in which the film thickness of the magnetic layer is merely increased as in the magnetic bias film in the related art. This will be described with reference to the drawings.

Figure 4:
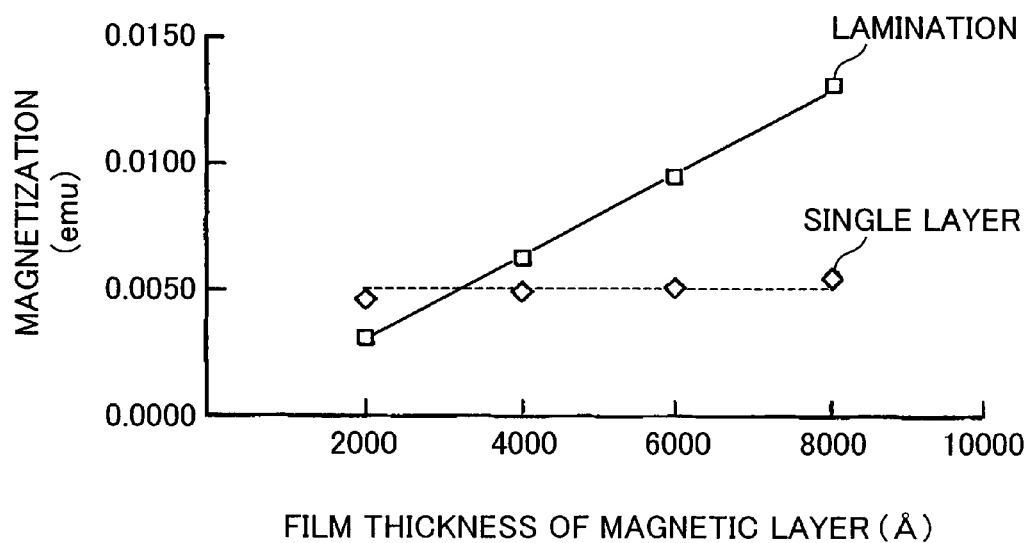
FIG. 4 is a view showing the relation of a film thickness and magnetization in a magnetic bias film in the related art and in the magnetic bias film according to the second embodiment of the invention.

FIG. 4 shows magnetic properties of the magnetic bias film of a single-layer structure in the related art and the magnetic bias film of a laminated structure in this embodiment. The abscissa is used for the film thickness of the magnetic layer indicated in units of A and the ordinate is used for magnetization of the magnetic layer indicated in units of emu.

Referring to FIG. 4, the results of the magnetic bias films of the laminated structure and the single-layer structure are indicated by boxes (or tilted boxes), and these results are linked by a solid line and a dotted line almost on straight lines. Herein, 2000 Å is given to the single magnetic layer 12 in the magnetic bias film of the laminated structure. Hence, the thicknesses of 4000 Å, 6000 Å, and 8000 Å mean that the magnetic bias film comprises two, three, and four magnetic layers 12, respectively. The non-magnetic layer 13 is interposed between these magnetic layers 12.

As can be understood from FIG. 4, the magnitude of magnetization hardly changes in the magnetic bias film of the single-layer structure in the related art by increasing the film thickness. On the contrary, magnetization is increased with the film thickness in the magnetic bias film of the laminated structure of this embodiment. The reason why is not completely explained logically; however, the reason why is roughly thought as follows.

Figure 5:
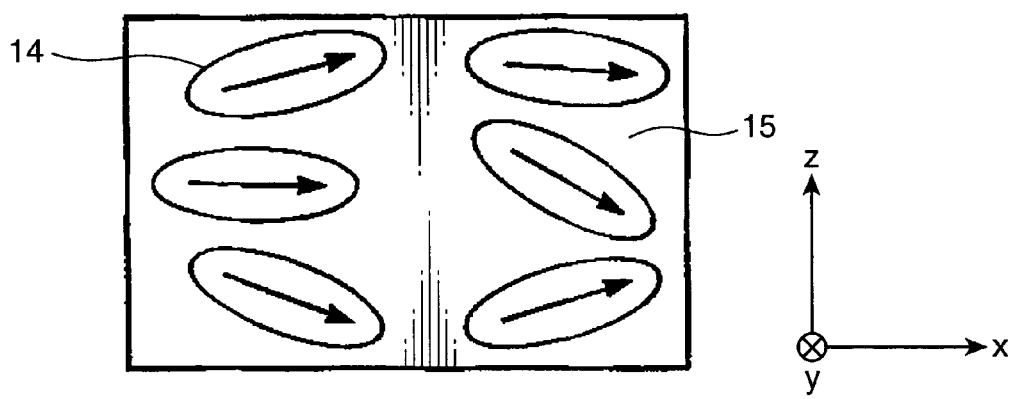
FIG. 5 is a longitudinal cross section of a magnetic bias film of a single-layer structure in the related art.
Figure 6:
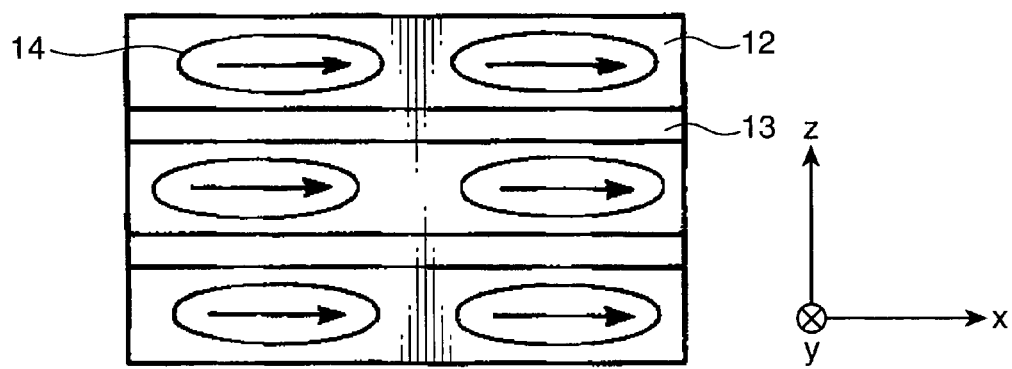
FIG. 6 is a longitudinal cross section of the magnetic bias film according to the second embodiment of the invention.

FIG. 5 is a longitudinal cross section of the magnetic bias film of the single-layer structure in the related art. FIG. 6 is a longitudinal cross section of the magnetic bias film of the laminated structure in this embodiment. Each of them is a cross section on the x-z plane of FIG. 3.

Crystal grains 14 are present within a magnetic bias film 15 of the single-layer structure in the related art shown in FIG. 5. Also, the orientations of the magnetic moments of the crystal grains 14 are indicated by arrows inside the crystal grains 14.

As is shown in FIG. 5, the crystal grains 14 are thought to be of substantially an elliptical shape, and the long axis directions of the crystal grains 14 are present randomly within the magnetic bias film 15 of a thin single-layer structure while being aligned relatively in the long side direction (x direction). When the thickness of the magnetic bias film 15 of the single-layer structure is merely increased, the number of the crystal grains 14 present within is increased correspondingly. However, the long axis directions of the crystal grains 14 are oriented not only in the long side directions but also in the thickness direction (z direction) perpendicular to the long side directions.

In this case, the magnetic bias film 15 of the single-layer structure in the related art as a whole generates a magnetic field in the long side direction of the magnetic bias film 15 of the single-layer structure. However, the magnetic moments of the respective crystal grains 14 have also a component in the thickness direction of the magnetic bias film 15 of the single-layer structure. The magnetic field component in the thickness direction does not contribute to the strength of the magnetic field in the long side direction of the magnetic bias film 15 of the single-layer structure. It is therefore thought that the components in the thickness direction that the magnetic moments of the crystal grains 14 have are increased as the thickness of the magnetic bias film 15 of the single-layer structure is increased. It is therefore thought that the magnetic field in the long side direction is not increased correspondingly by merely increasing the thickness of the magnetic bias film 15 of the single-layer structure.

On the contrary, in the magnetic bias film 11 of the laminated structure of the invention shown in FIG. 6 having the configuration in which the magnetic layers 12 are laminated via the non-magnetic layers 13, the respective magnetic layers 12 are separated by the non-magnetic layers 13. The orientation of the respective crystal grains 14 are therefore dominated by the thickness of the respective magnetic layers 12, and the long axis directions of the crystal grains 14 are present while being aligned relatively in the long side direction. This lessens the components in the thickness direction of the magnetic moments of the respective crystal grains 14. The magnetic moments of the crystal grains 14 are therefore thought to contribute to the strength of the magnetic field in the long side direction.

The orientations of the magnetic moments on the x axis shown in FIG. 6 (either it is leftward or rightward in the drawing) are shown schematically, and it does not necessarily mean that all the magnetic moments are aligned in the same direction.

It is not clear why the crystal grains 14 take on substantially an elliptical shape. However, because the magnetic bias film 11 of the laminated structure of the invention is of a flattened structure in which the film thickness of the magnetic layer 12 is particularly thin and the thickness direction with respect to the long side direction is extremely short, the crystal grains 14 are thought to take on substantially an elliptical shape oriented in the long side direction at the time of film deposition or polarization.

Further, influences of the demagnetizing field that depend on the shape of the magnetic bias film 11 are thought to be present to no small extent. Assume that the lengths of the magnetic bias film 11 in the lateral direction (x direction) in FIG. 5 and FIG. 6 are equal by ignoring the length in a direction (y direction) perpendicular to the sheet surface. That is, the magnetic bias film 11 of the single-layer structure and the single magnetic layer 12 forming the laminated structure are different in length in the thickness direction (z direction) alone.

In this instance, the demagnetizing factors in the thickness direction (z direction) of the magnetic bias films 11 of the single-layer structure and the laminated structure are almost equal. On the contrary, the demagnetizing factor in the x direction is large in the single-layer structure shown in FIG. 5 whereas it is small in the single magnetic layer 12 forming the laminated structure shown in FIG. 6. However, the value of the demagnetizing factor in the x direction of either structure takes a vale smaller than the demagnetizing factor in the z direction. Hence, a difference between the values of the demagnetizing factors in the x direction and the z direction is larger in the laminated structure shown in FIG. 6 than in the single-layer structure shown in FIG. 5.

That is to say, in the laminated structure shown in FIG. 6, magnetization in the x direction is stabilized, because the effective field in the lateral direction (x direction) in the sheet surface is large and the effective field in the longitudinal direction (z direction) in the sheet surface is small in comparison with the former effective field. On the contrary, in the single-layer structure shown in FIG. 5, magnetization in the x direction becomes unstable, because a difference between the effective fields in the longitudinal direction (z direction) and the lateral direction (x direction) on the sheet surface is small. The magnetization is thus readily oriented in the z direction (thickness direction).

The thickness of the magnetic layer 12 is preferably in a range of 250 Å to 2500 Å. When the thickness of the magnetic layer 12 is smaller than 250 Å, a magnetic field generated by the magnetic layer 12 becomes small. Meanwhile, even when the thickness of the magnetic layer 12 is larger than 2500 Å, as is shown in FIG. 5, the components in the thickness direction of the magnetic moments of the crystal grains 14 are increased further, and the strength of the magnetic field hardly changes. It is therefore preferable to set the thickness of the magnetic layer 12 in a range of 250 Å to 2500 Å.

Also, the thickness of the non-magnetic layer 13 is preferably in a range of 50 Å to 500 Å. Herein, when the thickness of the non-magnetic layer 13 is smaller than 50 Å, the magnetic layers 12 disposed above and beneath the non-magnetic layer 13 may possibly interfere with each other and give adverse influences. Meanwhile, when the thickness of the non-magnetic layer 13 is larger than 500 Å, the entire thickness is undesirably increased. It is therefore preferable to set the thickness of the non-magnetic layer 13 in a range of 50 Å to 500 Å.

The non-magnetic layers 13 forming the magnetic bias film 11 are not limited to Cr as is described in this embodiment, and other non-magnetic elements, such as Ti, Cu, Al, Sn, Nb, Au, Ag, Ta, and W can be used as well.

Also, in a case where the magnetic layer 12 and the non-magnetic layer 13 are formed to manufacture the magnetic bias film 11, the magnetic layer 12 and the non-magnetic layer 13 are formed on the surface of the substrate (not shown) by means of vapor deposition or sputtering in the second embodiment of the invention. The invention is not limited to this formation method, and for example, the magnetic layer 12 and the non-magnetic layer 13 may be formed by forming CoPt alloy and Cr alternately plural times by a wet method. Alternatively, the magnetic layer 12 and the non-magnetic layer 13 may be formed by alternately applying a CoPt precursor and a Cr precursor plural times by another wet method followed by sintering.

Further, because at least two magnetic layers 12 are necessary, it is desirable to dispose the magnetic layers 12 at the uppermost layer and the lowermost layer of the lamination to further reduce a total thickness of the magnetic bias film 11.

As has been described, in the second embodiment of the invention, because the magnetic bias film 11 is formed by laminating plural magnetized magnetic layers 12 and non-magnetic layers 13, it is possible to obtain the magnetic bias film 11 that generates a large magnetic field in response to the thickness of the magnetic layer 12.

Third Embodiment

Figure 7:
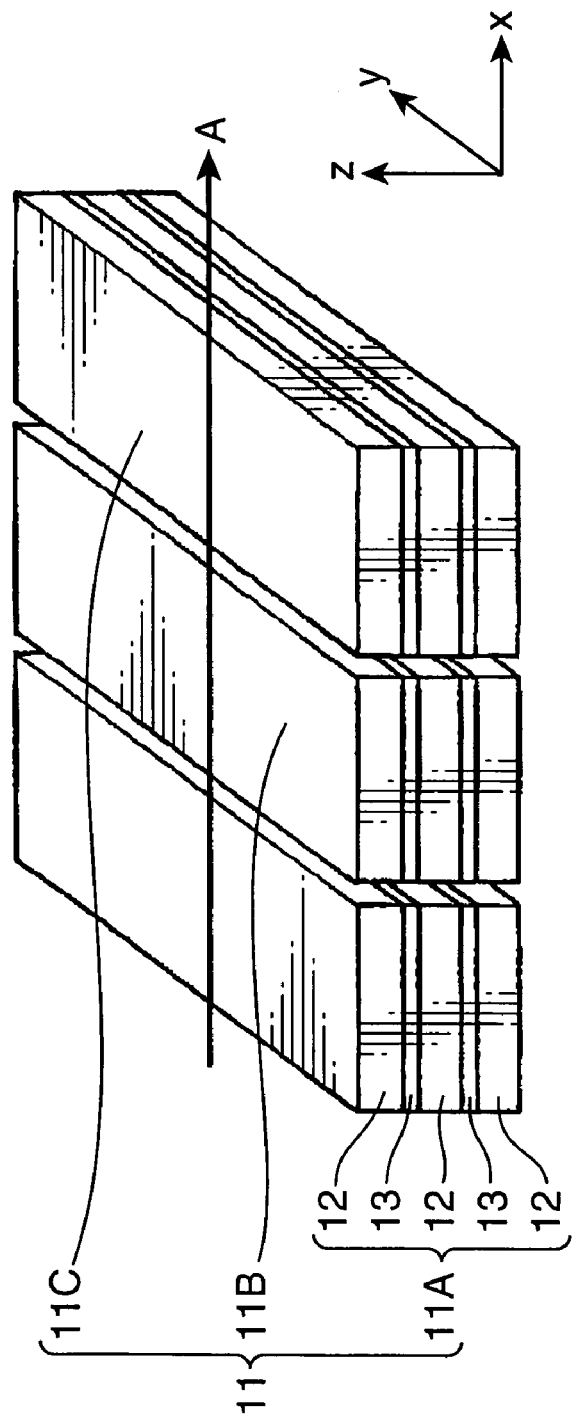
FIG. 7 is a perspective view of a magnetic bias film according to a third embodiment of the invention.

FIG. 7 is a perspective view of a magnetic bias film according to a third embodiment of the invention. A magnetic bias film 11 according to the third embodiment of the invention comprises plural magnetic bias magnets 11A through 11C, and generates a magnetic field in a direction (x direction) indicated by an arrow A. The magnetic bias magnet 11A is of a structure in which plural magnetic layers 12 made of CoPt alloy and non-magnetic layers 13 made of Cr are laminated, and it is in the shape of substantially a rectangular prism having the long side (y direction), the short side (x direction), and the thickness (z direction), which is also the lamination direction of the magnetic bias film 11A, in order of decreasing lengths.

As to the respective sides in this embodiment, the length of the long side (y direction) is 700 μm, the length of the short side (x direction) is 140 μm, and both intervals between the magnetic bias magnets 11A and 11B and between the magnetic bias magnets 11B and 11C are 10 μm. The thicknesses (z direction) of the magnetic layer 12 and the non-magnetic layer 13 are 2000 Å and 250 Å, respectively. The aspect ratio of the long side with respect to the short side of the magnetic bias magnet 11A is therefore 700 μm/140 μm=5.

Also, the aspect ratio of the long side with respect to the thickness of the magnetic layer 12 (=length of long side/thickness) is 700 ml/0.2 μm=3500. Further, the aspect ratio of the short side with respect to the thickness of the magnetic layer 12 (=length of short side/thickness) is 140 μm/0.2 μm=700.

The other magnetic bias magnets 11B and 11C are of the same configuration as the magnetic bias magnet 11A, and these are arrayed in the lateral direction of the drawing, that is, in the short side direction (x direction) of substantially a rectangular prism while aligning the magnetic field directions. These magnetic bias magnets 11A through 11C together constitute the magnetic bias film 11.

Herein, the aspect ratio of the short side (x direction) and the long side (y direction) of the magnetic bias magnets 11A through 11C is preferably in a range of 5 to 200, and more preferably in a range of 10 to 200 as in the first and second embodiments above. To be more specific, this is because when the aspect ratio of the long side and the short side of the magnetic bias magnets 11A through 11C is smaller than 5, the stability of the bias magnetic field is deteriorated, and when the aspect ratio is larger than 200, the absolute strength of the bias magnetic field becomes too large.

A manufacturing method of the magnetic bias film 11 according to the third embodiment of the invention configured as described above will now be described.

The magnetic layer 12 made of CoPt alloy is formed on the surface of a substrate (not shown) by means of vapor deposition or sputtering, and the non-magnetic layer 13 made of Cr is formed on the top surface of this magnetic layer 12 by means of vapor deposition or sputtering. Further, the magnetic layer 12 is formed on the top surface of the non-magnetic layer 13, and by repeating these procedures, it is possible to obtain a laminated film in which plural magnetic layers 12 and non-magnetic layers 13 are laminated.

After resist is applied, the patterning using the photolithographic technique is performed by means of exposure and development, and then the laminated film is divided by means of etching. Plural laminated films in the shape of substantially a rectangular prism can be thus obtained.

In these plural laminated films in the shape of substantially a rectangular prism, by applying a specific magnetic field in the long side direction or the short side direction, it is possible to obtain the magnetic bias magnets 11A through 11C in which the magnetic layers in the laminated film in the shape of substantially a rectangular prism are magnetized in the long side direction or the short side direction.

Also, in such a configuration, the magnetic bias film 11 is magnetized more readily in the short side direction than in the long side direction. More specifically, in the magnetic bias film 11 magnetized in the short side direction, the magnetization direction hardly changes even when a large magnetic field is applied from the outside in comparison with a case where it is magnetized in the long side direction. In other words, it is thought that large magnetic anisotropy is provided in the short side direction rather in the long side direction in this embodiment. This state will be described with reference to FIG. 8.

Figure 8:
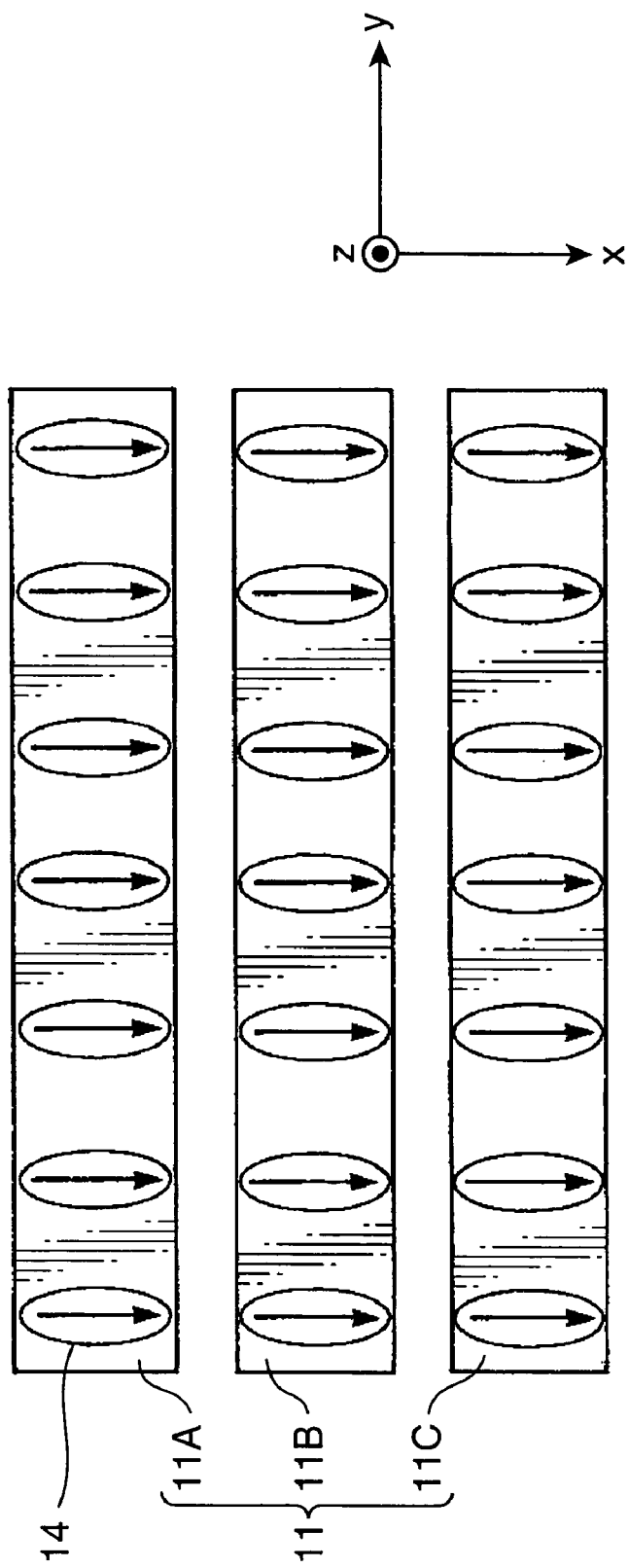
FIG. 8 is a top view of the magnetic bias film according to the third embodiment of the invention.

FIG. 8 is a top view of the magnetic bias film 11 according to the third embodiment of the invention. Herein, the magnetic layers 12 are magnetized in the short side direction (x direction) of the magnetic bias magnets 11A through 11C. In this case, a magnetic bias that remains stable against the external magnetic field can be generated by disposing the magnetic moments in the short side direction (x direction) rather than disposing the magnetic moments in the long side direction (y direction). The reason why is not clearly explained logically. However, interactions among the magnetic bias magnets 11A through 11C and interactions among the respective magnetic layers 12 caused by laminating plural magnetic layers 12 are thought to be involved.

Figure 9:
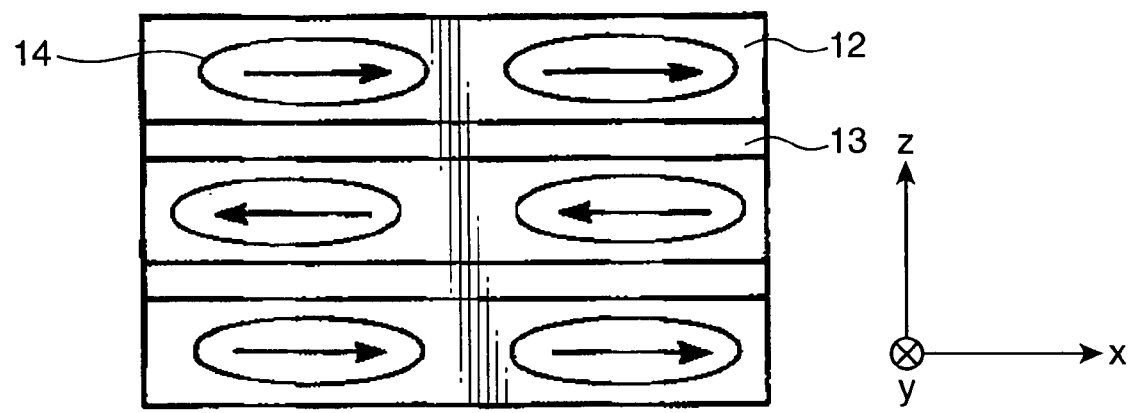
FIG. 9 is a longitudinal cross section of the magnetic bias film according to the third embodiment of the invention.

FIG. 9 is a longitudinal cross section (the cross section on the x-z plane of FIG. 7) of the magnetic bias film of the laminated structure in this embodiment. In this embodiment, of the three magnetic layers 12, the orientation of magnetization of the magnetic layer 12 in the middle is thought to be reversed to the orientation of the magnetization of the other magnetic layers due to magnetostatic coupling among the magnetic layers 12. It is therefore preferable to laminate an odd number of magnetic layers 12 in the magnetic bias film of this embodiment. This is because the magnetic bias film 11 having properties that remain stable against a magnetic field from the outside can be obtained when configured in this manner.

Also, in the third embodiment of this invention, there is an effect achieved from the configuration in which the magnetic layers 12 are laminated by interposing the non-magnetic layer 13 in between as has been described in the second embodiment of the invention. In short, there is an effect that the magnetic field becomes stronger with an increasing number of the magnetic layers 12.

As has been described, in the magnetic bias film 11 according to the third embodiment of the invention, the magnetic bias magnets 11A through 11C, each of which is in the shape of substantially a rectangular prism formed by laminating plural magnetic layers 12 and non-magnetic layers 13 alternately, are arrayed in the short side direction of substantially a rectangular prism. Also, because the aspect ratio of the short side and the long side is set in a range of 5 to 200 for these magnetic bias magnets 11A through 11C, it is possible to obtain a strong magnetic field in comparison with the single-layer magnetic bias film in the related art. This provides effects that not only can the magnetic bias film be reduced in size, but also a magnetic field that remains stable against an external magnetic field can be obtained.

Also, as to the thickness of the magnetic layer 12 and the thickness of the non-magnetic layer 13 in the third embodiment of the invention, it is preferable to set the thickness of the magnetic layer 12 in a range of 250 Å to 2500 Å, and it is preferable to set the thickness of the non-magnetic layer 13 in a range of 50 Å to 500 Å as in the second embodiment of the invention described above.

The non-magnetic layers 13 forming the magnetic bias film 11 is not limited to Cr as described in the third embodiment of the invention, and other non-magnetic elements, such as Ti, Cu, Al, Sn, Nb, Au, Ag, Ta, and W, can be used as well.

The method of obtaining the magnetic bias magnets 11A through 11C is not limited to the method of obtaining the magnetic bias magnets 11A through 11C by forming a large laminated film of CoPt alloy and Cr first and then dividing the film by means of etching as the manufacturing method of the magnetic film in the third embodiment of the invention described above, and the magnetic bias magnets 11A through 11C may be formed in a divided state from the start. In this case, a laminated film of CoPt alloy and Cr is formed using a mask having the shapes of the magnetic bias magnets 11A through 11C.

Fourth Embodiment

Figure 10:
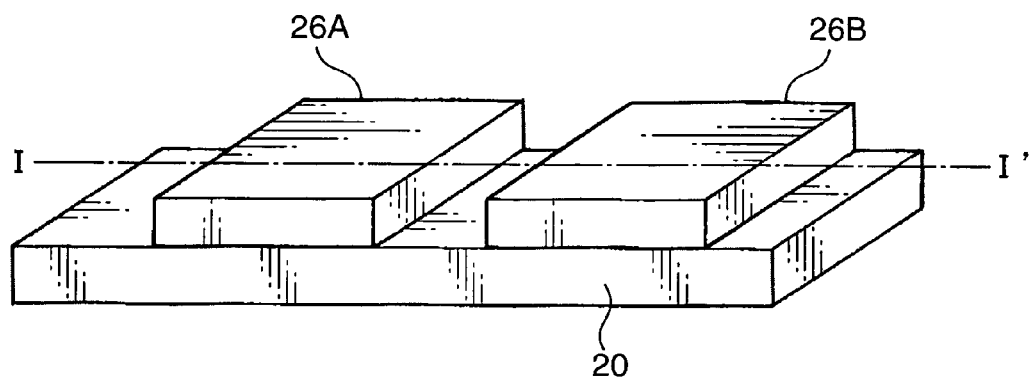
FIG. 10 is a perspective view of a magnetic sensor according to a fourth embodiment of the invention.
Figure 11:
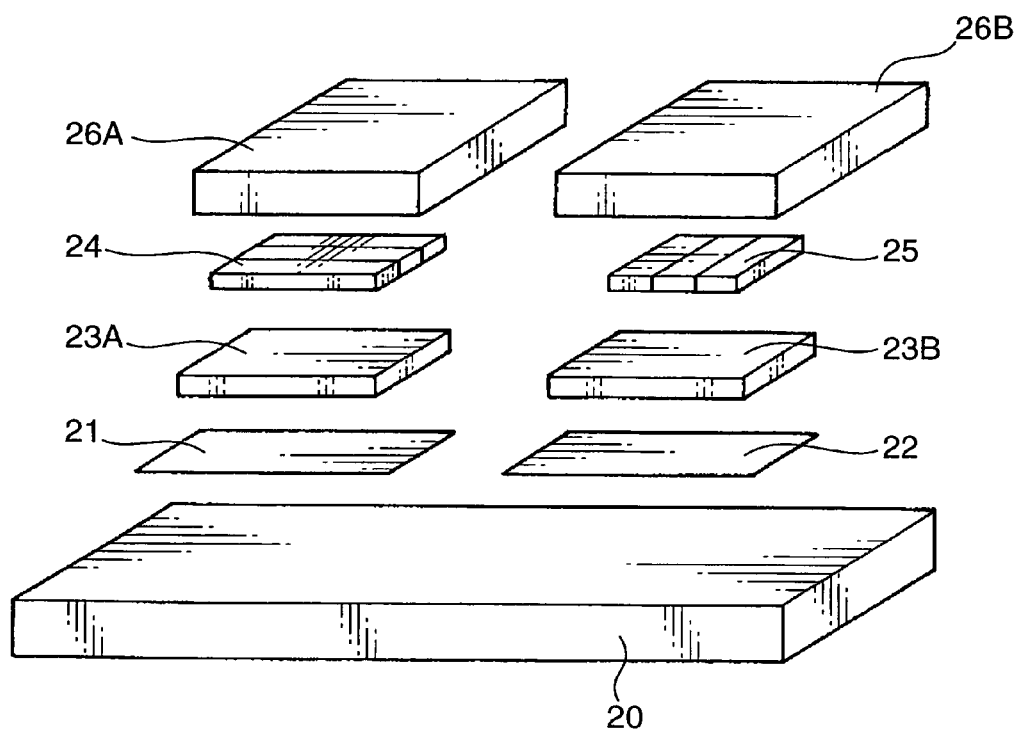
FIG. 11 is an exploded perspective view of the magnetic sensor according to the fourth embodiment of the invention.
Figure 12:
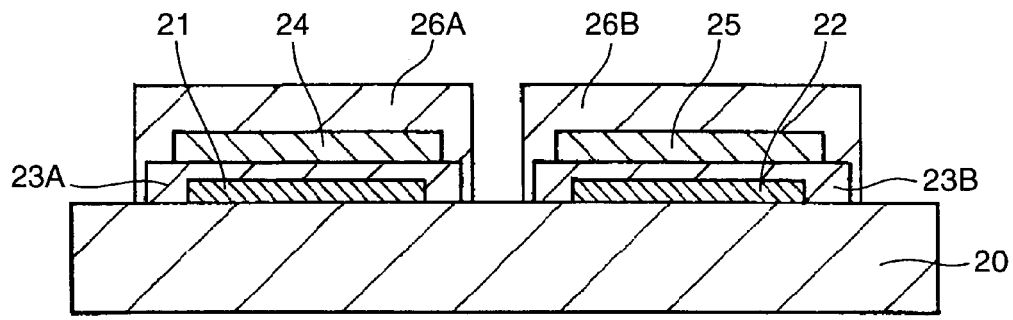
FIG. 12 is a cross section taken along the line I-I' of the magnetic sensor according to the fourth embodiment of the invention.
Figure 13:
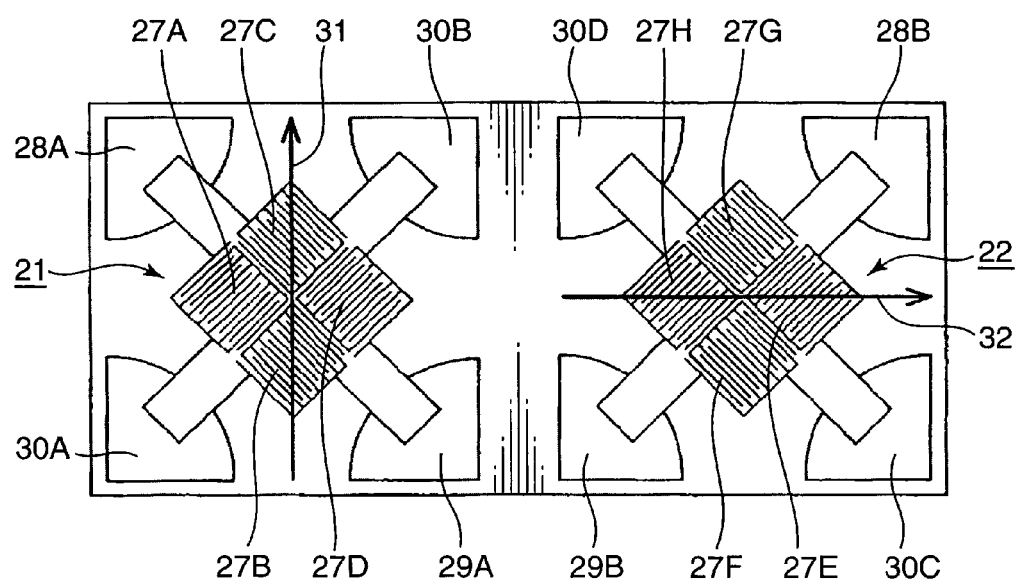
FIG. 13 is a top view of first and second magnetic detection portions in the magnetic sensor according to the fourth embodiment of the invention.
Figure 14:
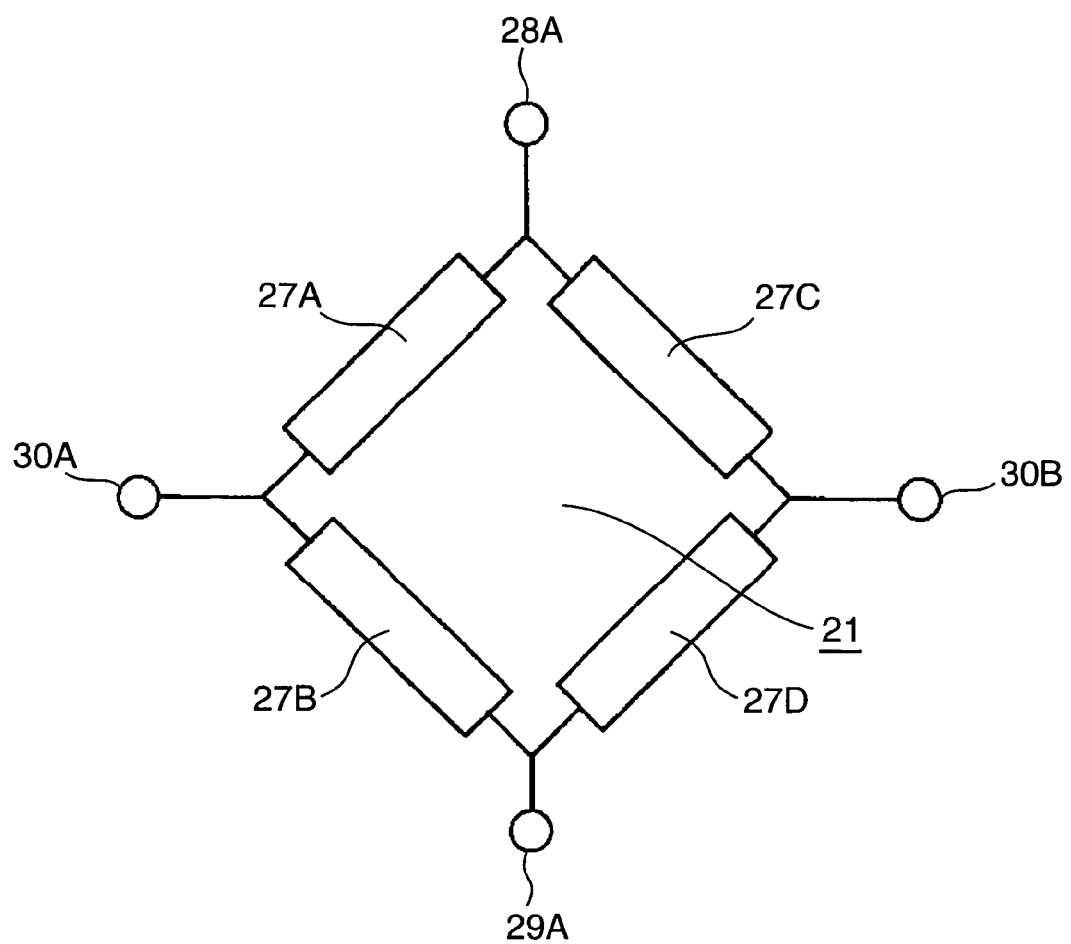
FIG. 14 is a circuit diagram of a first magnetic detection portion in the magnetic sensor according to the fourth embodiment of the invention.

FIG. 10 is a perspective view of a magnetic sensor according to a fourth embodiment of the invention. FIG. 11 is an exploded perspective view of the magnetic sensor. FIG. 12 is a cross section taken along the line I-I' of FIG. 10. FIG. 13 is a top view of first and second magnetic detection portions in the magnetic sensor. FIG. 14 is a circuit diagram of the first magnetic detection portion in the magnetic sensor.

Referring to FIG. 10 through FIG. 14, it is preferable that a substrate 20 is made of a material having an insulation property, such as alumina, and that a glass glazed layer (not shown) is formed on the top surface (main surface). The glass glazed layer is used because not only can a smooth surface be readily obtained, but also first and second magnetic detection portions 21 and 22 can be formed on its top surface with ease.

In this embodiment, each of the first magnetic detection portion 21 and the second detection portion 22 comprises four magnetic detecting elements. The magnetic detecting element is an element that outputs a signal in response to the orientation and magnitude of a magnetic field and is therefore used to detect the orientation of the magnetic field or the like. Examples include an element using the magneto resistance effect (magneto resistance effect element), a Hall element, a magneto impedance effect element, etc.

These magnetic detecting elements are formed of a magneto resistance film formed on the top surface of the substrate 20. The magneto resistance film is formed of a magnetic film, such as a ferromagnetic thin film including NiCo or NiFe, and an artificial latticed multi-layer film. The first and second magnetic detection portions 21 and 22 reach the maximum amount of change in resistance when an external magnetic field is applied perpendicularly to the surface on which they are formed.

Also, the magneto resistance film forming the first and second magnetic detection portions 21 and 22 is formed by being folded plural times. This is because the number of lines crossing magnetism (for example, earth magnetism) that needs to be measured is increased by being folded plural times, and an amount of change in resistance is increased, which can in turn enhance the detection sensitivity.

A first insulation layer 23A is made of $SiO_2$ having an insulation property, and covers the first magnetic detection portion 21 to electrically isolate the first magnetic detection portion 21 from a first magnetic bias film 24 described below. As with the first insulation layer 23A, a second insulation layer 23B is also made of $SiO_2$ having an insulation property, and covers the second magnetic detection portion 22 to electrically isolate the second magnetic detection portion 22 from a second magnetic bias film 25 described below.

The first magnetic bias film 24 is formed on the top surface of the first insulation layer 23A and applies a magnetic bias to the first magnetic detection portion 21. The first magnetic bias film 24 is the magnetic bias film 11 described in the third embodiment of the invention above, that is, the magnetic bias film 11 that comprises the magnetic bias magnets 11A through 11C, in each of which plural magnetic layers 12 made of CoPt alloy and magnetized in one direction and plural non-magnetic layers 13 made of Cr are laminated alternately while the aspect ratio of the short side and the long side is set in a range of 5 to 200 by arraying the plural magnetic bias magnets 11A through 11C in the short side direction to generate a magnetic field in the short side direction.

The second magnetic bias film 25 is formed on the top surface of the second insulation layer 23B and applies a magnetic bias to the second magnetic detection portion 22. The second magnetic bias film 25 also uses the magnetic bias film 11 described in the third embodiment of the invention above. The first and second magnetic bias films 24 and 25 have a large rate of change of resistance values in the first and second magnetic detection portions 21 and 22, and they are adjusted in such a manner that the resistance values change almost linearly in response to a change of the magnetic field.

A first covering layer 26A is made of epoxy resin, silicon resin, or the like, and covers the first magnetic bias film 24. Likewise, a second covering layer 26B is made of epoxy resin, silicon resin, or the like, and covers the second magnetic bias film 25.

A first magnetic detecting element 27A and a second magnetic detecting element 27B are electrically connected in series, and the longitudinal directions of their patterns are different by 90°. Also, a third magnetic detecting element 27C and a fourth magnetic detecting element 27D are electrically connected in series, and the longitudinal directions of their patterns are different by 90°. Further, the first magnetic detecting element 27A and the second magnetic detecting element 27B are electrically connected to the third magnetic detecting element 27C and the fourth magnetic detecting element 27D in parallel. Also, the longitudinal directions of the patterns of the first magnetic detecting element 27A and the third magnetic detecting element 27C are different by 90°.

A first input electrode 28A is formed on the substrate 20, and is electrically connected to the first magnetic detecting element 27A and to the third magnetic detecting element 27C. A first ground electrode 29A is electrically connected to the second magnetic detecting element 27B and to the fourth magnetic detecting element 27D. A first output electrode 30A is electrically connected to the first magnetic detecting element 27A and to the second magnetic detecting element 27B, and a second output electrode 30B is electrically connected to the third magnetic detecting element 27C and to the fourth magnetic detecting element 27D. Also, as with the first magnetic detection portion 21, the second magnetic detection portion 22 comprises a fifth magnetic detecting element 27E through an eighth magnetic detecting element 27H, a second input electrode 28B, a second ground electrode 29B, a third output electrode 30C, and a fourth output electrode 30D. These components correspond, respectively, to the first magnetic detecting element 27A through the fourth magnetic detecting element 27D, the first input electrode 28A, the first ground electrode 29A, the first output electrode 30A, and the second output electrode 30B in the first magnetic detection portion 21.

The first input electrode 28A and the second input electrode 28B are electrically connected to each other, and the first ground electrode 29A and the second ground electrode 29B are also electrically connected to each other. The first magnetic detection portion 21 and the second magnetic detection portion 22 are therefore electrically connected in parallel. Also, the first input electrode 28A, the second input electrode 28B, the first ground electrode 29A, the second ground electrode 29B, and the first output electrode 30A through the fourth output electrode 30D are made of silver or silver palladium.

Each of the first magnetic detecting element 27A through the fourth magnetic detecting element 27D that together form the first magnetic detection portion 21 is formed of a magneto resistance film, and as is shown in FIG. 14, they constitute a Wheatstone bridge circuit as a whole. Hence, a difference between two output voltages (differential output voltage) obtained from the first output electrode 30A and the second output electrode 30B becomes larger, which enables the orientation to be detected with accuracy. Further, because noises of the two output voltages can be canceled, it is possible to suppress detection variations caused by noises.

A magnetic field 31 in FIG. 13 specifies the direction of a magnetic field that the first magnetic bias film 24 applies to the first magnetic detection portion 21. Meanwhile, a magnetic field 32 specifies the direction of a magnetic field that the second magnetic bias film 25 applies to the second magnetic detection portion 22, and this direction is different from that of the magnetic field 31 by 90°.

In this embodiment, it is configured in such a manner that an angle produced by the magnetic fields generated by the first and second magnetic bias films 24 and 25 and the longitudinal directions of the respective patterns of the first magnetic detecting element 27A through the eighth magnetic detecting element 27H is 45°. The magnetic fields generated by the first and second magnetic bias films 24 and 25 at the angle of 0° or 180° do not contribute to a change in resistance of the first through eighth magnetic detecting elements 27A through 27H, and therefore they do not play a role of the bias magnetic fields. Hence, the angle may be other than 45°; however, it is preferable to exclude angles of 0° and 180°.

A manufacturing method of the magnetic sensor according to the fourth embodiment of the invention configured as described above will now be described.

Initially, the first magnetic detecting element 27A through the eighth magnetic detecting elements 27H, the first input electrode 28A, the second input electrode 28B, the first ground electrode 29A, the second ground electrode 29B, the first output electrode 30A, the second output electrode 30B, the third output electrode 30C, and the fourth output electrode 30D are formed on the top surface of the substrate 20 by means of printing, vapor deposition, or the like.

In this instance, the first magnetic detection portion 21 comprising the first magnetic detecting element 27A through the fourth magnetic detecting element 27D is formed, while the first input electrode 28A, the first ground electrode 29A, the first output electrode 30A, and the second output electrode 30B are formed at their specific positions. Likewise, the second magnetic detection portion 22 comprising the fifth magnetic detecting element 27E through the eighth magnetic detecting element 27H is formed, while the second input electrode 28B, the second ground electrode 29B, the third output electrode 30C, and the fourth output electrode 30D are formed at their specific positions.

Subsequently, the first insulation layer 23A is formed on the top surface of the first magnetic detection portion 21, and the second insulation layer 23B is formed on the top surface of the second magnetic detection portion 22. In this instance, the first insulation layer 23A is formed to cover at least the first magnetic detecting element 27A through the fourth magnetic detecting element 27D, and the second insulation layer 23B is formed to cover at least the fifth magnetic detecting element 27E through the eighth magnetic detecting element 27H.

Subsequently, the first magnetic bias film 24 is formed on the top surface of the first insulation layer 23A at a position opposing the first magnetic detection portion 21 by means of vapor deposition, sputtering, or the like, and the second magnetic bias film 25 is formed on the top surface of the second insulation layer 23B at a position opposing the second magnetic detection portion 22 by means of vapor deposition, sputtering, or the like.

The orientations of the respective magnetic fields are then set by bringing a magnetic field generating coil into close proximity to the first magnetic bias film 24 and to the second magnetic bias film 25. In this instance, it is configured in such a manner that an angle produced by the magnetic fields generated by the first magnetic bias film 24 and the second magnetic bias film 25 and the longitudinal directions of the respective patterns of the first magnetic detecting element 27A through the eighth magnetic detecting element 27H is 45°. In addition, it is configured in such a manner that the directions of the magnetic fields generated by the first magnetic bias film 24 and the second magnetic bias film 25 are different from each other by approximately 90°.

Finally, the first covering layer 26A is formed on the top surface of the first magnetic bias film 24 by means of molding or the like, and the second covering film 26B is formed on the top surface of the second magnetic bias film 25 by means of molding or the like.

The magnetic sensor according to the fourth embodiment of the invention can be obtained by the manufacturing method described above.

When the first magnetic bias film 24 and the second magnetic bias film 25 are formed by the lift-off method, there can be achieved an effect that damages on the first insulation layer 23A and the second insulation layer 23B or on the first magnetic detection portion 21 and the second magnetic detection portion 22 can be prevented. More specifically, it may be configured in such a manner that after resist is applied to a portion where the first magnetic bias film 24 and the second magnetic bias film 25 are not formed, the CoPt film is formed across the entire surfaces of the first insulation layer 23A and the second insulation layer 23B, and the first magnetic bias film 24 and the second magnetic bias film 25 are formed at the specific positions by removing the resist later.

In this case, the unwanted CoPt film can be removed simultaneously by merely removing the resist, the need to remove the CoPt film directly as in the etching method can be eliminated. It is thus possible to prevent an etching liquid or the like from adhering to or penetrating into the first insulation layer 23A and the second insulation layer 23B or the first magnetic detection portion 21 and the second magnetic detection portion 22.

In particular, in a case where CoPt alloy is used for the first magnetic bias film 24 and the second magnetic bias film 25, it is necessary to use a strongly acidic etching liquid. Hence, the etching liquid gives damages as it adheres to or penetrates into the first insulation layer 23A and the second insulation layer 23B or the first magnetic detection portion 21 and the second magnetic detection portion 22, and may possibly deteriorate the moisture resistance. The lift-off method, however, does not raise such a problem and a magnetic sensor as a highly reliable orientation sensor can be obtained.

Also, by setting the orientations of the magnetic fields after the first magnetic bias film 24 and the second magnetic bias film 25 are formed, it is possible to set the orientations of the magnetic fields generated by the first magnetic bias film 24 and the second magnetic bias film 25 simultaneously or in succession. The productivity can be therefore enhanced.

Alternatively, magnetic thin films in which the orientation of the magnetic field has been previously set may be disposed on the top surface of the first insulation layer 23A and the second insulation layer 23B.

Operations of the magnetic sensor according to the fourth embodiment of the invention will now be described.

Referring to FIG. 10 through FIG. 14, when a specific voltage is applied between the first input electrode 28A and the first ground electrode 29A in the first magnetic detection portion 21, a change in resistance in response to the direction of the earth magnetization is caused in the first magnetic detecting element 27A through the fourth magnetic detecting element 27D. Because voltages in response to the change of the resistance value are outputted consequently from the first output electrode 30A and the second output electrode 30B, it is possible to detect a differential output voltage between these electrodes. The differential output voltage changes with an angle at which the earth magnetization crosses with the first magnetic detection portion 21, and it shapes substantially a sine wave by rotating the orientation of the earth magnetization by 360°.

As with the description above, by applying a specific voltage between the second input electrode 28B and the second ground electrode 29B in the second magnetic detection portion 22, a change in resistance in response to the direction of the earth magnetization is caused in the fifth magnetic detecting element 27E through the eighth magnetic detecting element 27H. Because voltages in response to a change of the resistance value are outputted consequently from the third output electrode 30C and the fourth output electrode 30D, it is possible to detect a differential output voltage between these electrodes. As with the description above, this differential output voltage also changes with an angle at which the earth magnetization crosses with the second magnetic detection portion 15, and it shapes substantially a sine wave by rotating the direction of the earth magnetization by 360°.

By making the magnetic field directions between the first magnetic bias film 24 and the second magnetic bias film 25 different by 90° as in this embodiment, the phases of one differential output voltage and the other differential output voltage are shifted by 90°. More specifically, given θ as the orientation in reference to a specific one direction, then, in a case where one differential output voltage is Asinθ, the other differential output voltage is Acosθ. Because a ratio of these two outputs is tanθ, the orientation θ can be readily detected.

The bias magnetic field strengths of the first magnetic bias film 24 and the second magnetic bias film 25 will now be described.

Figure 15:
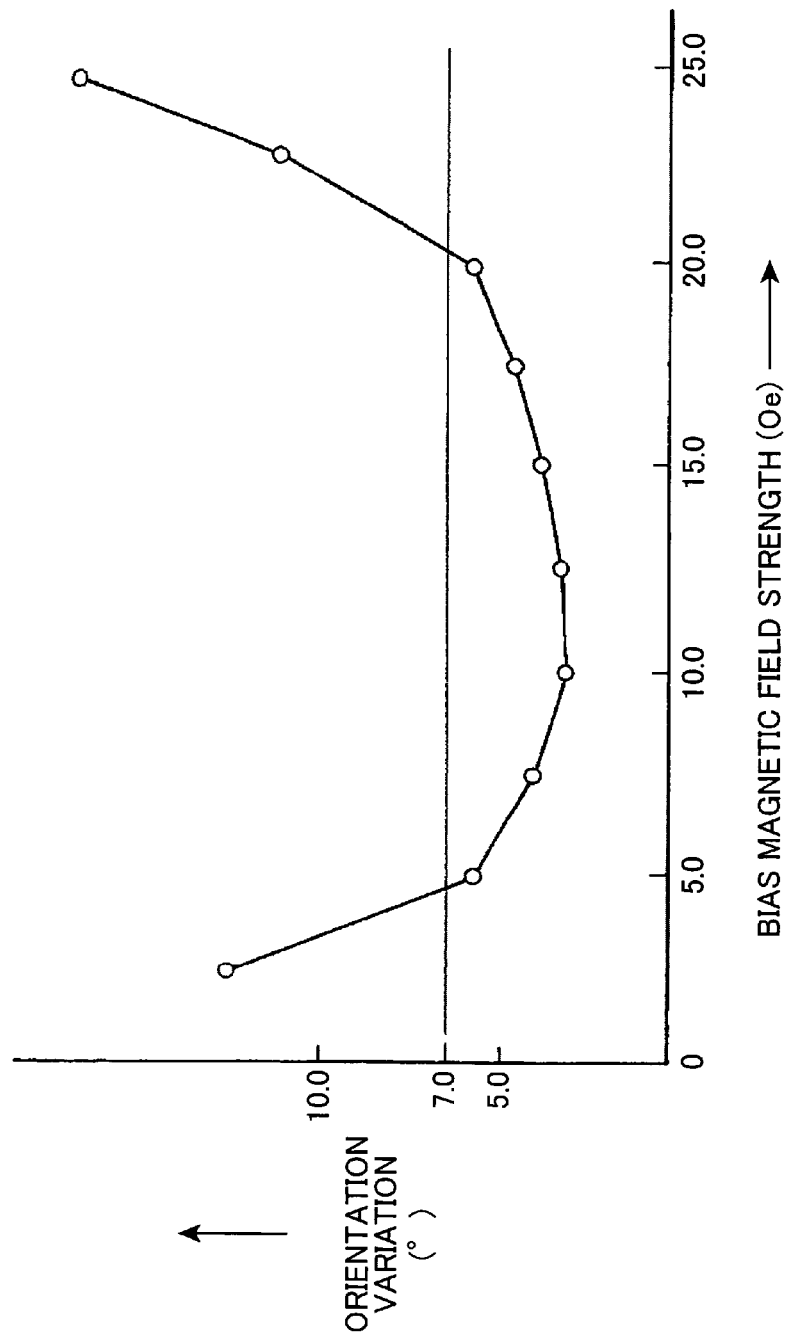
FIG. 15 is a view showing the relation of the bias magnetic field strength and an orientation variation in the magnetic sensor according to the fourth embodiment of the invention.

FIG. 15 is a view showing the relation of the bias magnetic field strength of the magnetic sensor and an orientation variation in this embodiment. Because the orientation variation that the magnetic sensor detects is increased when the bias magnetic field strength becomes too strong or too weak, appropriate strength has to be set. An allowable variation of the orientation to detect 36 orientations is thought to be 7°. For the bias magnetic field in this case, 5 to 20 Oe is suitable as can be understood from FIG. 15.

When a required orientation variation is made smaller, the strength of the bias magnetic field is limited further. For example, when an allowable variation of the orientation is 5°, the bias magnetic field is limited to 6 to 18 Oe, and more preferably, the bias magnetic field is limited to 7.5 to 15 Oe.

In the magnetic sensor in this embodiment described above, as the first and second magnetic bias films 24 and 25 that apply magnetic biases, respectively, to the first and second magnetic detection portions 21 and 22 having the magneto resistance effect, the magnetic bias film 11 is used, which is formed by arraying the magnetic bias magnets 11A through 11C, each of which is in the shape of substantially a rectangular prism and formed by laminating plural magnetic layers 12 and non-magnetic layers 13 alternately while the aspect ratio of the short side and the long side is set in a range of 5 to 200, in the short side direction to generate a magnetic field in the short side direction. A total film thickness of the magnetic bias film 11 can be therefore smaller, and a stable magnetic bias can be obtained. It is thus possible to obtain a magnetic sensor that can be reduced in size and has properties that remain stable against a magnetic field from the outside.

Also, the magnetic bias from the first magnetic bias film 24 is applied to the first magnetic detection portion 21, while the magnetic bias from the second magnetic bias film 25 is applied to the second magnetic detection portion 22. By making the directions of the magnetic field generated by the first magnetic bias film 24 and the magnetic field generated by the second magnetic bias film 25 different, it is possible to obtain a compact, high-sensitive magnetic sensor suitable to detection of the direction of earth magnetization.

In particular, because it is configured in such a manner that directions of the magnetic field generated by the first magnetic bias film 24 and the magnetic field generated by the second magnetic bias film 25 are different by 90°, an output waveform from the first magnetic detection portion 21 and an output waveform from the second magnetic detection portion 22 have a phase difference of 90°. By finding a ratio of these two waveform outputs, it is possible to obtain a magnetic sensor of a simple configuration capable of detecting the direction of an external magnetic field.

It goes without saying that the directions of the magnetic field generated by the first magnetic bias film 24 and the magnetic field generated by the second magnetic bias film 25 can be set to an angle other than 90°. In this case, the orientations of the magnetic fields generated by the first magnetic bias film 24 and the second magnetic bias film 25 are made different so that the phases of the outputs from the first magnetic detection portion 21 and the second magnetic detection portion 22 differ from each other.

According to this configuration, because an output from the first magnetic detection portion 21 shapes a sine wave, it takes the same value at angles in two orientations; however, it is possible to determine a single angle according to the sign of a difference between an output of the first magnetic detection portion 21 and an output of the second magnetic detection portion 22. All the orientations in a range of 0 to 360° can be therefore detected. In this instance, it is necessary to make the orientations of the magnetic fields different to the extent that the waveforms of the respective outputs of the first magnetic detection portion 21 and the second magnetic detection portion 22 will not superimpose.

The magnetic sensor of the invention is not limited to the configuration of the magnetic sensor in this embodiment, and, for example, a modification as follows is possible.

Figure 16:
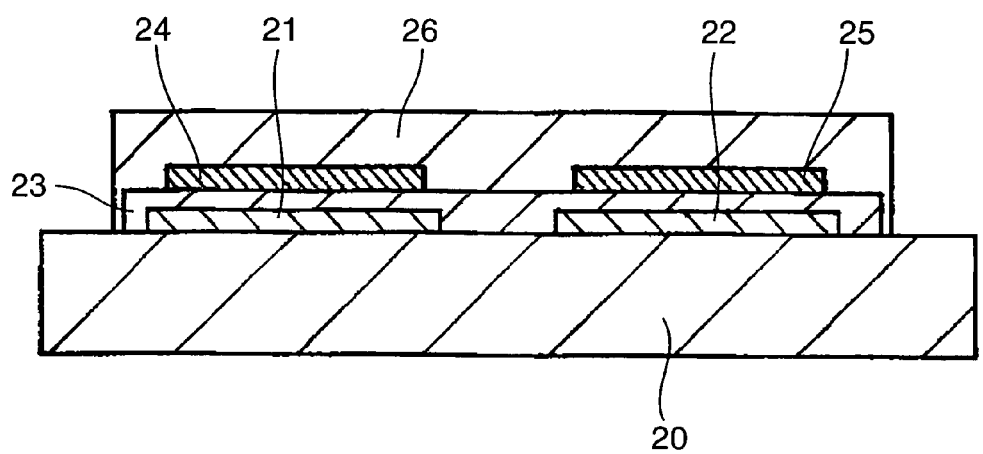
FIG. 16 is a cross section showing a modification of the magnetic sensor according to the fourth embodiment of the invention.

FIG. 16 is a cross section showing a modification of the magnetic sensor according to the fourth embodiment of the invention. In the magnetic sensor shown in FIG. 10 through FIG. 12, the insulation layer 23A and the insulation layer 23B are separate, individual layers, and the covering layer 26A and the covering layer 26B are also separate, individual layers. In the magnetic sensor shown in FIG. 16, however, it is configured in such a manner that an insulation layer 23 covers both the first magnetic detection portion 21 and the second magnetic detection portion 22. Also, it is configured in such a manner that a covering layer 26 covers both the first magnetic bias film 24 and the second magnetic bias film 25. Even when configured in this manner, it is possible to achieve the same effects as those of the magnetic sensor shown in FIG. 10 through FIG. 12.

Also, the magnetic bias film 11 described in the second embodiment of the invention, that is, the one in which plural magnetized magnetic layers 12 and non-magnetic layers 13 are laminated alternately, may be used as the first magnetic bias film 24 and the second magnetic bias film 25. In this case, because the magnetic bias film 11 has the effects as described in the second embodiment, there can be achieved an effect that the magnetic sensor according to the fourth embodiment of the invention can be also reduced in size due to these effects.

The first and second magnetic bias films 24 and 25 may be the magnetic bias films described in the first embodiment of the invention, that is, the one formed by arraying plural magnetic bias magnets 9A through 9G, each of which is in the shape of substantially a rectangular prism having the long side, the short side, and the thickness in order of decreasing lengths and generates a magnetic field, in the short side direction while aligning the directions of the magnetic fields.

This magnetic sensor can obtain a stable magnetic bias because it includes the first and second magnetic bias films 24 and 25 that use the magnetic bias film 9 formed by arraying plural magnetic bias magnets 9A through 9G, each of which has an aspect ratio of the long side and the short side set in a range of 5 to 200, in the short side direction while aligning the directions of the magnetic fields. It is thus possible to obtain a magnetic sensor with which properties of the magnetic field remain stable against a magnetic field from the outside.

Fifth Embodiment

Figure 17:
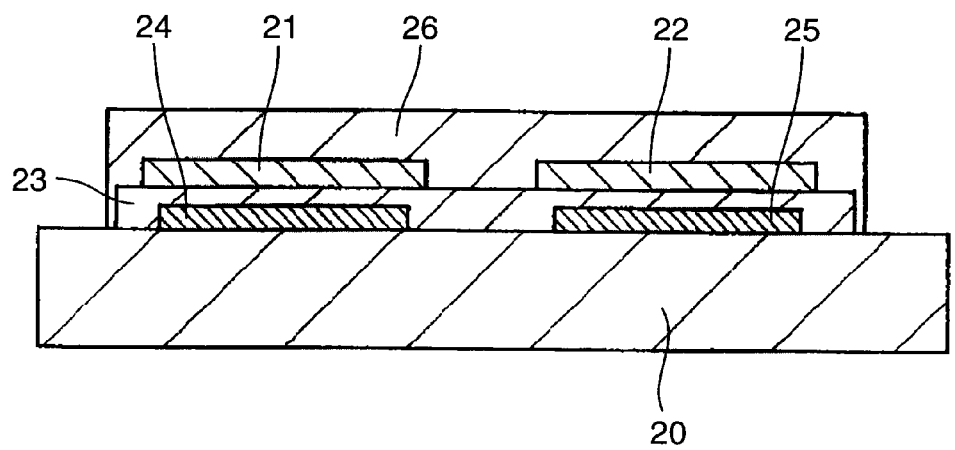
FIG. 17 is a cross section of a magnetic sensor according to a fifth embodiment of the invention.

FIG. 17 is a cross section of a magnetic sensor according to a fifth embodiment of the invention. For the magnetic sensor according to the fifth embodiment of the invention, like components are labeled with like reference numerals with respect to the magnetic sensor according to the fourth embodiment of the invention described above, and only differences will be described herein.

That is to say, differences of the magnetic sensor according to the fifth embodiment of the invention from the magnetic sensor according to the fourth embodiment of the invention are as follows. In the magnetic sensor according to the fourth embodiment of the invention described above, the first magnetic detection portion 21 and the second magnetic detection portion 22 are formed directly on the top surface of the substrate 20. On the contrary, in the magnetic sensor according to the fifth embodiment of the invention, the first magnetic bias film 24 and the second magnetic bias film 25 are formed directly on the top surface of the substrate 20. Even when configured in this manner, it is possible to achieve the same effects as those of the magnetic sensor according to the fourth embodiment of the invention described above.

It should be appreciated, however, that the magnetic sensor of the invention is not limited to the contents described in the fourth and fifth embodiments of the invention described above.

For example, the fourth and fifth embodiments of the invention described above adopt the method of detecting a differential output voltage by employing the Wheatstone bridge circuit using four magnetic detecting elements as each of the first magnetic detection portion 21 and the second magnetic detection portion 22. However, a method using a half bridge circuit configuration employing two magnetic detecting elements may be adopted. This will be described using FIG. 18.

Figure 18:
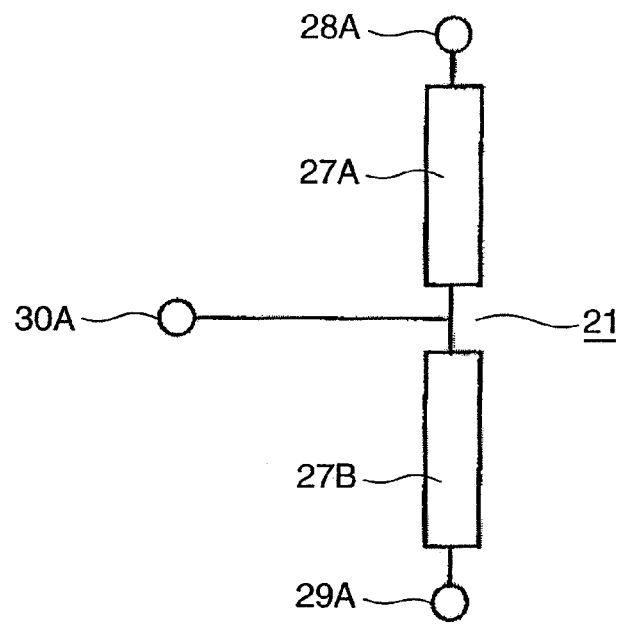
FIG. 18 is a circuit diagram showing a modification of a magnetic detection portion in the magnetic sensor according to the fifth embodiment of the invention.
Figure 19:
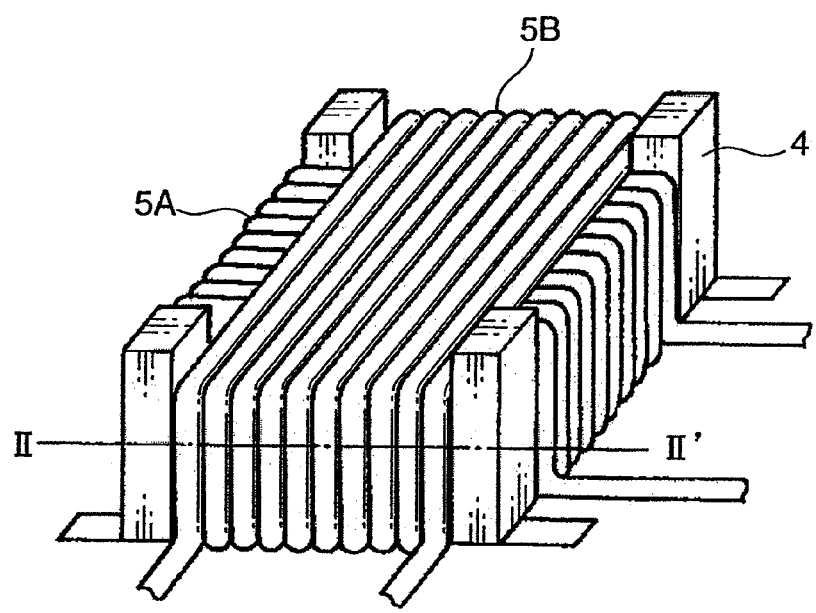
FIG. 19 is a perspective view of a magnetic sensor in the related art.

FIG. 18 is a circuit diagram showing a modification of a magnetic detection portion in the magnetic sensor according to the fifth embodiment of the invention. As is shown in FIG. 18, the first magnetic detection portion 21 comprises a first magnetic detecting element 27A and a second magnetic detecting element 27B, and it detects a voltage between the first output electrode 30A and the first ground electrode 29A by applying a specific voltage between the first input electrode 28A and the first ground electrode 29A. This circuit configuration is referred to as the half bridge circuit because it has half the configuration of the Wheatstone bridge circuit. Also, the second magnetic detection portion 22 is configured in the same manner as the first magnetic detection portion 21.

In comparison with the Wheatstone bridge circuit, the half bridge circuit configuration described above has a simpler circuit configuration, because it requires half the number of detecting elements and an area needed for the circuit can be smaller, and is therefore advantageous in achieving a size reduction.

Other Embodiments (A) The fourth and fifth embodiments of the invention described the magnetic sensor serving as an orientation sensor. The invention, however, is not limited to these embodiments, and the invention is also applicable to other magnetic sensors using magnetic biases. For example, the invention is useful as a compact sensor that detects a particularly faint magnetic field, such as a magneto impedance effect element.

(B) In the embodiments of the invention, the magnetic bias magnets 9A through 9G in the first embodiment, the magnetic layers 12 in the second and third embodiments were described as those made of CoPt alloy. However, they may be made of other alloys, such as CoCr alloy and CoCrPt alloy, or ferrite magnet. In particular, as with CoPt alloy, CoCr alloy and CoCrPt alloy have large magnetocrystalline anisotropy in addition to an excellent magnet property. They are therefore suitable as a material of a magnetic bias magnet to which the stability of the magnetic field direction is required.

(C) The embodiments of the invention described a case where the insulation layer is made of $SiO_2$. However, the insulation layer may be made of other materials, such as alumina, epoxy resin, and silicon resin.

(D) The embodiments of the invention described a case where CoPt alloy to be used as the magnetic layers 12 is formed by means of vapor deposition or sputtering. However, the CoPt film may be formed by other methods, for example, by applying a CoPt precursor by a wet method followed by sintering.

(E) The embodiments of the invention described a case where the direction of the magnetic field of the magnetic bias film 11 is stabilized by applying manufacturing or adopting the laminated structure. However, besides these cases, a method by which a magnetic field in one direction is applied using a magnet or the like when the magnetic bias film 11 is formed (film deposition with magnetic field), and a method by which heat treatment is applied at a specific temperature while applying a magnetic field in one direction after the magnetic bias film 11 is formed (heat treatment with magnetic field) are included as means for actively providing such anisotropy in one direction (uniaxial anisotropy). The anisotropy provided by the film deposition with magnetic field and the heat treatment with magnetic field is normally referred to as induced magnetic anisotropy.

Further, available methods include means for providing uniaxial anisotropy to the magnetic bias film 11 using a counter result of magnetic strain, that is, by applying a stress while the magnetic bias film 11 is formed.

In this embodiment, too, it is preferable to provide magnetic anisotropy to the magnetic bias film 11 using these methods, because the bias magnetic field can be more stable.

(F) In the embodiments of the invention, the magnetic detecting elements were described as a ferromagnetic thin film including NiCo or NiFe serving as a magneto resistance film or an artificial latticed multi-layer film. However, besides these, they may be InSb or InAs, which are semiconductors having a large electron mobility and known to exhibit the magneto resistance effect.

While the invention has been described in detail, the descriptions above are illustrative in all aspects and the invention is not limited to these descriptions. It is therefore understood that a large number of modifications that are not described herein can be anticipated without deviating from the scope of the invention.

INDUSTRIAL APPLICABILITY

The magnetic bias film of the invention is able to generate a stable and strong magnetic field within a plane perpendicular to the lamination direction of the magnetic layers. Because the magnetic bias film can be reduced in size and suitable for use in a magnetic sensor, it is industrially useful.

The invention claimed is:

1. A magnetic bias film including plural magnetic bias magnets each having magnetic layers and generating a magnetic field within a plane perpendicular to a lamination direction of the magnetic layers, wherein:
the magnetic bias magnets is manufactured in a shape of substantially a rectangular prism having long sides, short sides, and a thickness in the lamination direction in order of decreasing lengths while a ratio of the long sides with respect to the short sides in length is in a range of 5 to 200, and the plural magnetic bias magnets are disposed in a short side direction.

2. The magnetic bias film according to claim 1, wherein: the magnetic bias magnet further includes a non-magnetic layer, and two or more magnetic layers and one or two or more non-magnetic layers are laminated alternately.

3. The magnetic bias film according to claim 2, wherein: the non-magnetic layer is made of one of Cr, Ti, Cu, Al, Sn, Nb, Au, Ag, Ta, and W.

4. The magnetic bias film according to claim 2, wherein: a thickness of the non-magnetic layer is in a range of 50 Å to 500 Å.

5. The magnetic bias film according to claim 1, wherein: a direction of the magnetic field generated by the magnetic bias magnet is in a long side direction.

6. The magnetic bias film according to claim 2, wherein: a direction of the magnetic field generated by the magnetic bias magnets is in a short side direction.

7. The magnetic bias film according to claim 1, wherein: the magnetic layers are made of one of CoPt alloy, CoCr alloy, CoCrPt alloy, and ferrite magnet.

8. The magnetic bias film according to claim 1, wherein: a thickness of the magnetic layers is in a range of 250 Å to 2500 Å.

9. The magnetic bias film according to claim 1, wherein: the number of the magnetic layers is an odd number.

10. The magnetic bias film according to claim 1, wherein: strength of the generated magnetic field is 5 Oe or higher and 20 Oe or lower.

11. The magnetic bias film according to claim 1, wherein: magnetic anisotropy is provided to the magnetic layers as the magnetic layers are formed while a magnetic field is applied in one direction within the plane perpendicular to the lamination direction of the magnetic layers.

12. The magnetic bias film according to claim 1, wherein: magnetic anisotropy is provided to the magnetic layers as heat treatment is applied to the magnetic bias magnet at a specific temperature while a magnetic field is applied in one direction within the plane perpendicular to the lamination direction of the magnetic layers.

13. A magnetic sensor, comprising:
a substrate;
a first magnetic detection portion provided with at least two magnetic detecting elements formed on a main surface side of the substrate;
a second magnetic detection portion provided with at least two magnetic detecting elements formed on the main surface side of the substrate;
a first magnetic bias film provided at a position opposing the first magnetic detection portion; and
a second magnetic bias film provided at a position opposing the second magnetic detection portion,
wherein the first and second magnetic bias films are the magnetic bias film according to claim 1, and an orientation of a magnetic field generated by the first magnetic bias film and an orientation of a magnetic field generated by the second magnetic bias film are different.

14. The magnetic sensor according to claim 13, further comprising:
an insulation film that covers at least one of the first magnetic detection portion and the second magnetic detection portion.

15. The magnetic sensor according to claim 13, wherein the first magnetic detection portion includes:
a first magnetic detecting element;
a second magnetic detecting element that has a longitudinal direction of a pattern different from a longitudinal direction of a pattern of the first magnetic detecting element, and is electrically connected to the first magnetic detecting element in series;
a third magnetic detecting element that has a longitudinal direction of a pattern parallel to the longitudinal direction of the pattern of the second magnetic detecting element; and
a fourth magnetic detecting element that has a longitudinal direction of a pattern parallel to the longitudinal direction of the pattern of the first magnetic detecting element, and is electrically connected to the third magnetic detecting element in series,
the first magnetic detecting element and the second magnetic detecting element being electrically connected to the third magnetic detecting element and the fourth magnetic detecting element in parallel, and
wherein the second magnetic detection portion includes:
a fifth magnetic detecting element;
a sixth magnetic detecting element that has a longitudinal direction of a pattern different from a longitudinal direction of a pattern of the fifth magnetic detecting element, and is electrically connected to the fifth magnetic detecting element in series;
a seventh magnetic detecting element that has a longitudinal direction of a pattern parallel to the longitudinal direction of the pattern of the sixth magnetic detecting element; and
an eighth magnetic detecting element that has a longitudinal direction of a pattern parallel to the longitudinal direction of the pattern of the fifth magnetic detecting element, and is electrically connected to the seventh magnetic detecting element in series,
the fifth magnetic detecting element and the sixth magnetic detecting element being electrically connected to the seventh magnetic detecting element and the eighth magnetic detecting element in parallel.

16. The magnetic sensor according to claim 15, wherein: an angle produced by an orientation of a magnetic field generated by the first magnetic bias film and an orientation of a magnetic field generated by the second magnetic bias film is 90°, an angle produced by the longitudinal direction of the pattern of the first magnetic detecting element and the longitudinal direction of the pattern of the second magnetic detecting element is 90°, and an angle produced by the longitudinal direction of the pattern of the fifth magnetic detecting element and the longitudinal direction of the pattern of the sixth magnetic detecting element is 90°.

17. The magnetic sensor according to claim 16, wherein: an angle produced by an orientation of a magnetic field generated by the first magnetic bias film and the longitudinal direction of the pattern of the first magnetic detecting element is 45°; and
an angle produced by an orientation of a magnetic field generated by the second magnetic bias film and the longitudinal direction of the pattern of the fifth magnetic detecting element is 45°.

18. The magnetic sensor according to claim 13, wherein the first magnetic detection portion includes:
a first magnetic detecting element; and
a second magnetic detecting element that has a longitudinal direction of a pattern different from a longitudinal direction of a pattern of the first magnetic detecting element, and is electrically connected to the first magnetic detecting element in series, and wherein the second magnetic detection portion includes:

a third magnetic detecting element; and a fourth magnetic detecting element that has a longitudinal direction of a pattern different from a longitudinal direction of a pattern of the third magnetic detecting element, and is electrically connected to the third magnetic detecting element in series.

19. The magnetic sensor according to claim 13, wherein:

the magnetic detecting elements are formed of a magnetic film including NiCo or NiFe.

20. The magnetic sensor according to claim 13, wherein:

the insulation film is made of $SiO_2$.

* * * * *